(12) United States Patent
Watanabe (10) Patent No.: US 7,486,319 B2
(45) Date of Patent: Feb. 3, 2009

(54) SIGNAL GENERATING CIRCUIT INCLUDING DELAY-LOCKED LOOP AND SEMICONDUCTOR DEVICE INCLUDING SIGNAL GENERATING CIRCUIT

(75) Inventor: Takaki Watanabe, Fukuoka (JP)

(73) Assignee: Sony Corporation, Tokyo (JP)

( * ) Notice: Subject to any disclaimer, the term of this patent is extended or adjusted under 35 U.S.C. 154(b) by 913 days.

(21) Appl. No.: 10/853,280

(22) Filed: May 26, 2004

(65) Prior Publication Data
US 2004/0252569 A1    Dec. 16, 2004

(30) Foreign Application Priority Data
Jun. 13, 2003   (JP) ................ P2003-168942

(51) Int. Cl.
*H04N 3/14* (2006.01)
*H04N 5/335* (2006.01)

(52) U.S. Cl. ............... 348/294; 348/312; 348/374; 327/149; 327/158; 327/161

(58) Field of Classification Search ............ 348/294, 348/311–312, 211.4, 374; 237/149, 158, 237/261
See application file for complete search history.

(56) References Cited
U.S. PATENT DOCUMENTS
6,819,729 B2 * 11/2004 Takagi .................. 375/376
6,909,311 B2 * 6/2005 Foley et al. ............ 327/141
2002/0075047 A1 * 6/2002 Tsukikawa ............. 327/156
2002/0191094 A1 * 12/2002 Curtis et al. ............ 348/312
2005/0093597 A1 * 5/2005 Kwak .................. 327/158

FOREIGN PATENT DOCUMENTS
JP        11-341368      12/1999
JP        2000-341100    12/2000
JP        2002-016492     1/2002

OTHER PUBLICATIONS
Japanese Office Action, Application No. 2003-168942.

* cited by examiner

*Primary Examiner*—Lin Ye
*Assistant Examiner*—Gevell Selby
(74) *Attorney, Agent, or Firm*—Rader, Fishman & Grauer PLLC; Ronald P. Kananen

(57) ABSTRACT

According to a signal generating circuit including a delay-locked loop, a driving device including the signal generating circuit, and an image capturing apparatus including the signal generating circuit, when a rising edge designation signal for designating a predetermined rise time and a falling edge designation signal for designating a predetermined fall time are input, the signal generating circuit selects, from among a plurality of delay signals, a first delay signal rising at the time designated by the rising edge designation signal and a second delay signal rising at the time designated by the falling edge designation signal and outputs an output signal rising at the predetermined rise time and falling at the predetermined fall time by performing arithmetic processing on the first delay signal and the second delay signal.

9 Claims, 6 Drawing Sheets

SIGNAL GENERATING CIRCUIT INCLUDING DELAY-LOCKED LOOP AND SEMICONDUCTOR DEVICE INCLUDING SIGNAL GENERATING CIRCUIT

BACKGROUND OF THE INVENTION

1. Field of the Invention

The present invention relates to a signal generating circuit including a delay-locked loop, to a driving device for a solid-state imaging device, the driving device including the signal generating circuit, and to an image capturing apparatus including the signal generating circuit.

2. Description of the Related Art

Recently, in order to improve the performance of various types of electronic equipment, such electronic equipment has included a plurality of semiconductor devices combined in a complex manner. Also, the plurality of semiconductor devices has been operated in synchronization with each other at a predetermined timing.

For example, in image capturing apparatuses, such as digital cameras and video cameras, a solid-state imaging device, a signal-processing device, a memory device, and the like are operated in synchronization with each other at a predetermined timing using a driving device.

In order to operate a plurality of semiconductor devices at a predetermined timing, known electronic equipment includes a signal generating circuit for generating a signal that changes at the predetermined timing.

A signal generating circuit for generating an output signal that changes at a predetermined timing using a delay-locked loop (hereinafter, referred to as a DLL) for generating a plurality of delay signals obtained by delaying a reference signal by predetermined time intervals and an arithmetic circuit prepared in advance is known (for example, see PCT Japanese Translation Patent Publication No. 6-500673).

The signal generating circuit having such an arrangement generates the output signal that changes at the predetermined timing by causing the arithmetic circuit to perform predetermined arithmetic processing on some delay signals from among the plurality of delay signals generated by the DLL.

In the known signal generating circuit described above, the use of the arithmetic circuit installed in the signal generating circuit in advance allows generation of an output signal that changes at a predetermined timing from delay signals generated by the DLL. Thus, only an output signal that changes at fixed rise time and fall time is generated. Therefore, an output signal that changes at a desired timing cannot be generated.

Consequently, the known signal generating circuit cannot generate signals that change at various timings used for various types of electronic equipment. Thus, the known signal generating circuit lacks of versatility.

Also, in the known signal generating circuit, in order to generate a signal that changes at a timing suitable for the equipment used, it is necessary to design an arithmetic circuit again. Thus, a great deal of time and effort is required for the development of signal generating circuits.

SUMMARY OF THE INVENTION

According to an aspect of the present invention, a signal generating circuit for generating a predetermined output signal is provided that includes a delay-locked loop for generating a plurality of delay signals obtained by delaying a reference signal by predetermined time intervals. When a rising edge designation signal for designating a predetermined rise time and a falling edge designation signal for designating a predetermined fall time are input, the signal generating circuit generates the output signal rising at the predetermined rise time and falling at the predetermined fall time by performing arithmetic processing using, from among the plurality of delay signals, a first delay signal rising at the time designated by the rising edge designation signal and a second delay signal rising at the time designated by the falling edge designation signal. Thus, designating a rise time and a fall time of an output signal generates an output signal that changes at the desired times. Consequently, the versatility of a circuit can be increased. Also, since there is no need to individually develop a signal generating circuit suitable for the equipment used, time and effort used for the development can be reduced.

According to another aspect of the present invention, a signal generating circuit for generating a predetermined output signal is provided that includes a delay-locked loop for generating a plurality of delay signals obtained by delaying a reference signal by predetermined time intervals; a selecting circuit for selecting, in accordance with a rising edge designation signal for designating a predetermined rise time and a falling edge designation signal for designating a predetermined fall time, a first delay signal rising at the time designated by the rising edge designation signal and a second delay signal rising at the time designated by the falling edge designation signal from among the plurality of delay signals; a phase relationship detecting circuit for detecting the phase relationship between the first delay signal and the second delay signal; and a generating circuit including an arithmetic circuit, the generating circuit outputting the output signal rising at the predetermined rise time and falling at the predetermined fall time by performing arithmetic processing on the first delay signal and the second delay signal using the arithmetic circuit corresponding to the result of the detection. Thus, the circuit structure of a signal generating circuit for generating an output signal that changes at the desired times can be simplified. Consequently, increasing the size of the circuit can be avoided.

The phase relationship detecting circuit may include a most significant bit adder, a complement subtracter, and a decoder.

The generating circuit may select the arithmetic circuit from among a plurality of arithmetic circuits in accordance with the phase relationship detected by the phase relationship detecting circuit to perform the arithmetic processing. Thus, the circuit structure of a generating circuit can be simplified. Consequently, increasing the size of the circuit can be avoided.

According to another aspect of the present invention, a driving device for generating a predetermined output signal for controlling driving of a solid-state imaging device is provided that includes a signal generating circuit for generating the output signal. The signal generating circuit includes a delay-locked loop for generating a plurality of delay signals obtained by delaying a reference signal by predetermined time intervals. When a rising edge designation signal for designating a predetermined rise time and a falling edge designation signal for designating a predetermined fall time are input, the signal generating circuit generates the output signal rising at the predetermined rise time and falling at the predetermined fall time by performing arithmetic processing using, from among the plurality of delay signals, a first delay signal rising at the time designated by the rising edge designation signal and a second delay signal rising at the time designated by the falling edge designation signal. Thus, designating a rise time and a fall time of an output signal generates an output signal that changes at the desired times. Consequently, the versatility of a driving device can be increased.

Also, since there is no need to individually develop a driving device suitable for the equipment used, time and effort used for the development can be reduced.

According to another aspect of the present invention, a driving device for generating a predetermined output signal for controlling driving of a solid-state imaging device is provided that includes a signal generating circuit for generating the output signal. The signal generating circuit includes a delay-locked loop for generating a plurality of delay signals obtained by delaying a reference signal by predetermined time intervals; a selecting circuit for selecting, in accordance with a rising edge designation signal for designating a predetermined rise time and a falling edge designation signal for designating a predetermined fall time, a first delay signal rising at the time designated by the rising edge designation signal and a second delay signal rising at the time designated by the falling edge designation signal from among the plurality of delay signals; a phase relationship detecting circuit for detecting the phase relationship between the first delay signal and the second delay signal; and a generating circuit including an arithmetic circuit, the generating circuit outputting the output signal rising at the predetermined rise time and falling at the predetermined fall time by performing arithmetic processing on the first delay signal and the second delay signal using the arithmetic circuit corresponding to the result of the detection. Thus, the circuit structure of a signal generating circuit for generating an output signal that changes at the desired times can be simplified. Consequently, increasing the size of the circuit can be avoided and reductions in the size and cost of a driving device can be achieved.

The phase relationship detecting circuit may include a most significant bit adder, a complement subtracter, and a decoder.

The generating circuit may select the arithmetic circuit from among a plurality of arithmetic circuits in accordance with the phase relationship detected by the phase relationship detecting circuit to perform the arithmetic processing. Thus, the circuit structure of a generating circuit can be simplified. Consequently, increasing the size of the circuit can be avoided and reductions in the size and cost of a driving device can be achieved.

According to another aspect of the present invention, an image capturing apparatus including a driving device for generating a predetermined output signal for controlling driving of a solid-state imaging device is provided that includes a signal generating circuit for generating the output signal. The signal generating circuit includes a delay-locked loop for generating a plurality of delay signals obtained by delaying a reference signal by predetermined time intervals. When a rising edge designation signal for designating a predetermined rise time and a falling edge designation signal for designating a predetermined fall time are input, the signal generating circuit generates the output signal rising at the predetermined rise time and falling at the predetermined fall time by performing arithmetic processing using, from among the plurality of delay signals, a first delay signal rising at the time designated by the rising edge designation signal and a second delay signal rising at the time designated by the falling edge designation signal. Thus, designating a rise time and a fall time of an output signal generates an output signal that changes at the desired times. Consequently, the versatility of an image capturing apparatus can be increased. Also, since there is no need to individually develop a driving device suitable for the equipment used, time and effort used for development in the image capturing apparatus can be reduced.

According to another aspect of the present invention, an image capturing apparatus including a driving device for generating a predetermined output signal for controlling driving of a solid-state imaging device is provided that includes a signal generating circuit for generating the output signal. The signal generating circuit includes a delay-locked loop for generating a plurality of delay signals obtained by delaying a reference signal by predetermined time intervals; a selecting circuit for selecting, in accordance with a rising edge designation signal for designating a predetermined rise time and a falling edge designation signal for designating a predetermined fall time, a first delay signal rising at the time designated by the rising edge designation signal and a second delay signal rising at the time designated by the falling edge designation signal from among the plurality of delay signals; a phase relationship detecting circuit for detecting the phase relationship between the first delay signal and the second delay signal; and a generating circuit including an arithmetic circuit, the generating circuit outputting the output signal rising at the predetermined rise time and falling at the predetermined fall time by performing arithmetic processing on the first delay signal and the second delay signal using the arithmetic circuit corresponding to the result of the detection. Thus, the circuit structure of a signal generating circuit for generating an output signal that changes at the desired times can be simplified. Consequently, increasing the size of the circuit can be avoided and reductions in the size and cost of an image capturing apparatus can be achieved.

The phase relationship detecting circuit may include a most significant bit adder, a complement subtracter, and a decoder.

The generating circuit may select the arithmetic circuit from among a plurality of arithmetic circuits in accordance with the phase relationship detected by the phase relationship detecting circuit to perform the arithmetic processing. Thus, the circuit structure of a generating circuit can be simplified. Consequently, increasing the size of the circuit can be avoided and reductions in the size and cost of an image capturing apparatus can be achieved.

DESCRIPTION OF THE PREFERRED EMBODIMENTS

In an image capturing apparatus according to the present invention, a driving device is connected to a solid-state imaging device, such as a charge-coupled device (CCD), so that using a predetermined output signal (or control signal) generated by the driving device controls driving of the solid-state imaging device.

The driving device for the solid-state imaging device includes a signal generating circuit for generating the output signal.

Also, the signal generating circuit includes a delay-locked loop (DLL) for generating a plurality of delay signals obtained by delaying a reference signal by predetermined time intervals. Performing arithmetic processing on delay signals having the same period as that of a reference signal and having different phases from each other generates an output signal having a new waveform.

An embodiment of the present invention will be described with reference to the drawings.

Figure 1:
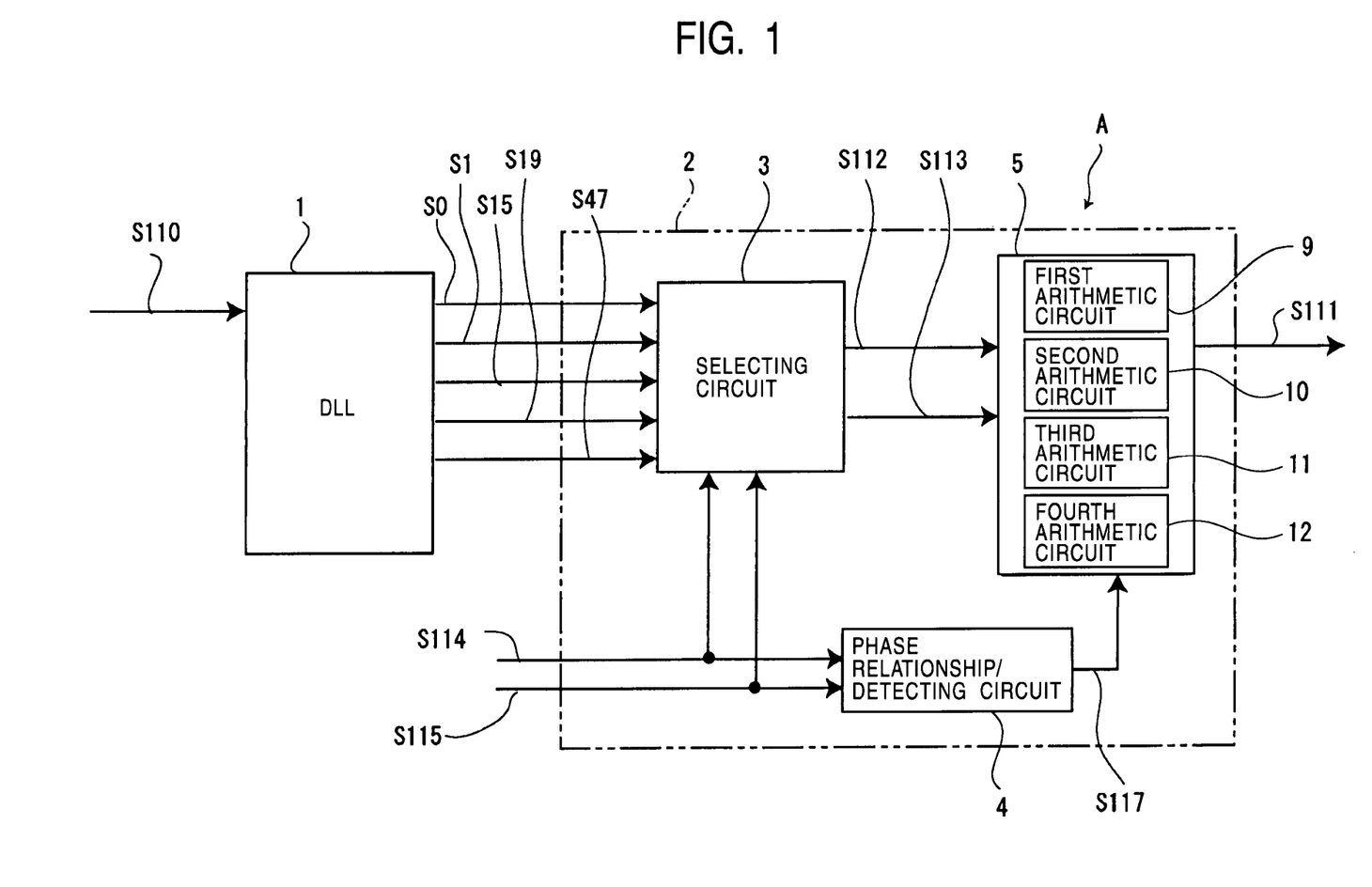
FIG. 1 is a block diagram of a signal generating circuit according to an embodiment.

Referring to FIG. 1, a signal generating circuit A according to the present invention includes a DLL 1 for generating forty-eight delay signals S0 to S47 obtained by delaying a captured reference signal S110 by predetermined time intervals and an arithmetic processing circuit 2 for performing arithmetic processing on the delay signals S0 to S47 to generate an output signal S111.

Figure 2:
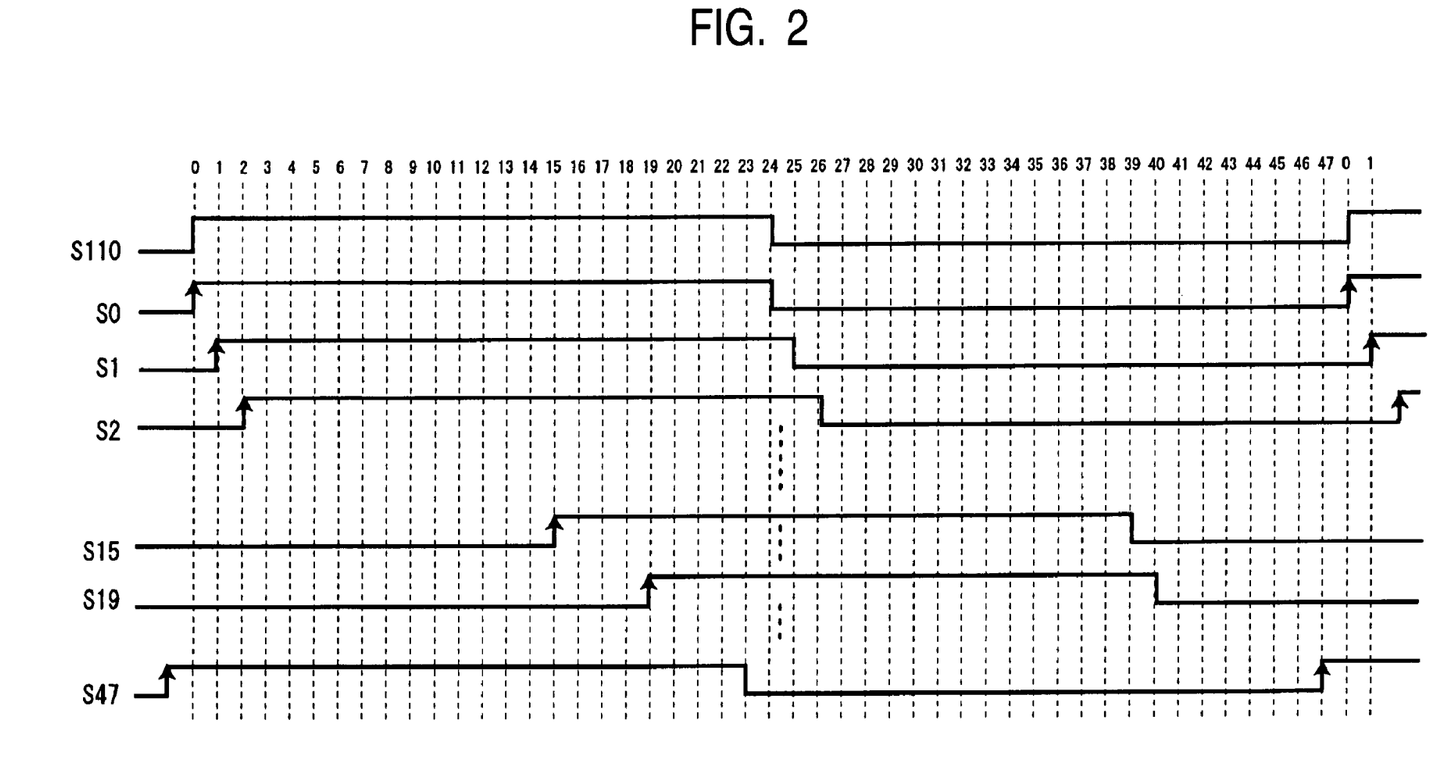
FIG. 2 is a timing chart of delay signals generated by a delay-locked loop.

Referring to FIG. 2, the DLL 1 generates the plurality of delay signals that are delayed by the same interval by dividing one period of the reference signal S110 into forty-eight equal intervals. In other words, the DLL1 generates, for example, a delay signal S0 in phase with the reference signal S110, a delay signal S1 delayed by 1/48 of the period of the reference signal S110 with respect to the reference signal S110, a delay signal S47 delayed by 47/48 of the period of the reference signal S110 with respect to the reference signal S110, and the like. The DLL 1 locks the rising edge.

Referring back to FIG. 1, the arithmetic processing circuit 2 includes a selecting circuit 3 for selecting, from among the delay signals S0 to S47, signals necessary for generating the output signal S111, a phase relationship detecting circuit 4 for detecting the phase relationship between the selected signals, and a generating circuit 5 for generating the output signal S111 by performing arithmetic processing on the selected signals.

In accordance with a rising edge designation signal S114 for designating a predetermined rise time and a falling edge designation signal S115 for designating a predetermined fall time, the selecting circuit 3 selects, from among the plurality of delay signals S0 to S47, a first delay signal S112 rising at the time designated by the rising edge designation signal S114 and a second delay signal S113 rising at the time designated by the falling edge designation signal S115. The selecting circuit 3 outputs the first delay signal S112 and the second delay signal S113 to the phase relationship detecting circuit 4 and the generating circuit 5.

Here, the rising edge designation signal S114 and the falling edge designation signal S115 are represented by 6-bit signals between "000000" (that is, "0" in decimal notation) and "101111" (that is, "47" in decimal notation).

The phase relationship detecting circuit 4 detects the phase difference between the rise time designated by the rising edge designation signal S114 and the fall time designated by the falling edge designation signal S115 to determine which pattern of the following seven patterns corresponds to the phase difference between the rise time and the fall time:

(1) a case where the rise time is delayed with respect to the fall time by more than half the period.

(2) a case where the rise time is delayed with respect to the fall time by half the period.

(3) a case where the rise time is delayed with respect to the fall time by less than half the period.

(4) a case where the rise time is in phase with the fall time.

(5) a case where the rise time is advanced with respect to the fall time by less than half the period.

(6) a case where the rise time is advanced with respect to the fall time by half the period.

(7) a case where the rise time is advanced with respect to the fall time by more than half the period.

The phase relationship detecting circuit 4 outputs an arithmetic circuit selection signal S117 corresponding to a pattern to the generating circuit 5 in accordance with the result of the determination.

Figure 3:
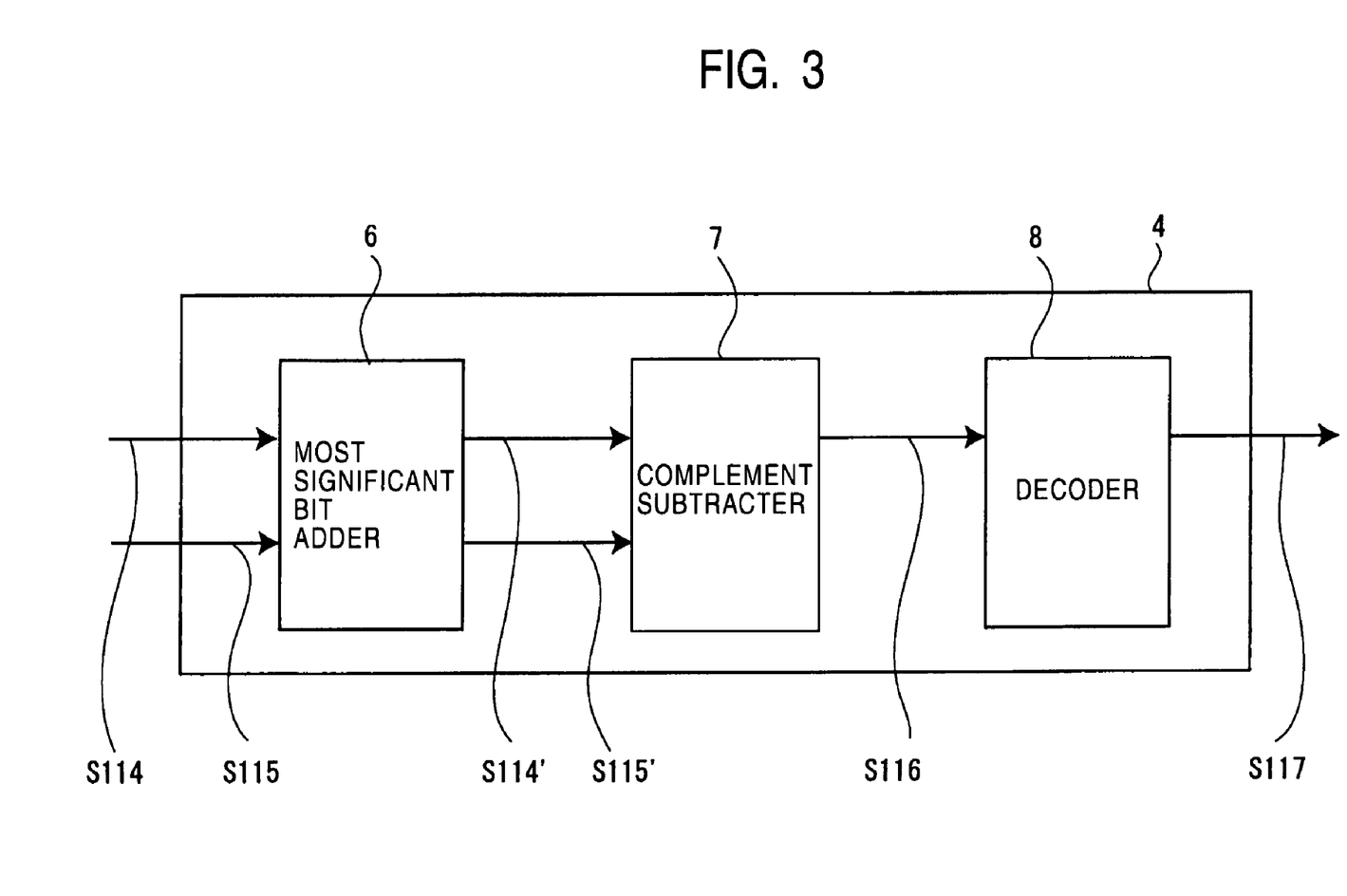
FIG. 3 is a block diagram of a phase relationship detecting circuit.

More specifically, as shown in FIG. 3, the phase relationship detecting circuit 4 includes a most significant bit adder 6 for adding "0" to the most significant bit to generate a 7-bit signal, a complement subtracter 7 for performing two's complement subtraction, and a decoder 8 connected in that order.

The rising edge designation signal S114 and the falling edge designation signal S115 are first input to the most significant bit adder 6, and "0" is added to the most significant bit of each of the rising edge designation signal S114 and the falling edge designation signal S115 to generate a 7-bit rising edge designation signal S114' and a 7-bit falling edge designation signal S115'. The rising edge designation signal S114' and the falling edge designation signal S115' are output to the complement subtracter 7.

The 7-bit rising edge designation signal S114' and the falling edge designation signal S115' are necessary when the complement subtracter 7 performs two's complement subtraction in the subsequent stage.

The complement subtracter 7 performs two's complement subtraction with respect to the rising edge designation signal S114' and the falling edge designation signal S115', in other words, it obtains a phase difference detection signal S116 by calculating a two's complement value of the rising edge designation signal S114' and adding it to the falling edge designation signal S115'. The complement subtracter 7 outputs the phase difference detection signal S116 to the decoder 8.

Here, the decoder 8 generates four patterns of arithmetic circuit selection signals S117 in accordance with the following seven patterns of phase difference detection signals S116:

(1)' If the relationship, "−48" in decimal notation<the phase difference detection signal S116<"−24" in decimal notation, is satisfied, the rise time is delayed with respect to the fall time by more than half the period. In this case, "01" is output as the arithmetic circuit selection signal S117.

(2)' If the relationship, "−24" in decimal notation=the phase difference detection signal S116, is satisfied, the rise time is delayed with respect to the fall time by half the period. In this case, "10" is output as the arithmetic circuit selection signal S117.

(3)' If the relationship, "−24" in decimal notation<the phase difference detection signal S116<"0" in decimal notation, is satisfied, the rise time is delayed with respect to the fall time by less than half the period. In this case, "00" is output as the arithmetic circuit selection signal S117.

(4)' If the relationship, "0" in decimal notation=the phase difference detection signal S116, is satisfied, the rise time is in phase with the fall time. In this case, "11" is output as the arithmetic circuit selection signal S117.

(5)' If the relationship, "0" in decimal notation<the phase difference detection signal S116<"24" in decimal notation, is satisfied, the rise time is advanced with respect to the fall time by less than half the period. In this case, "01" is output as the arithmetic circuit selection signal S117.

(6)' If the relationship, "24" in decimal notation=the phase difference detection signal S116, is satisfied, the rise time is advanced with respect to the fall time by half the period. In this case, "10" is output as the arithmetic circuit selection signal S117.

(7)' If the relationship, "24" in decimal notation<the phase difference detection signal S116<"48" in decimal notation, is satisfied, the rise time is advanced with respect to the fall time by more than half the period. In this case, "00" is output as the arithmetic circuit selection signal S117.

Figure 6:
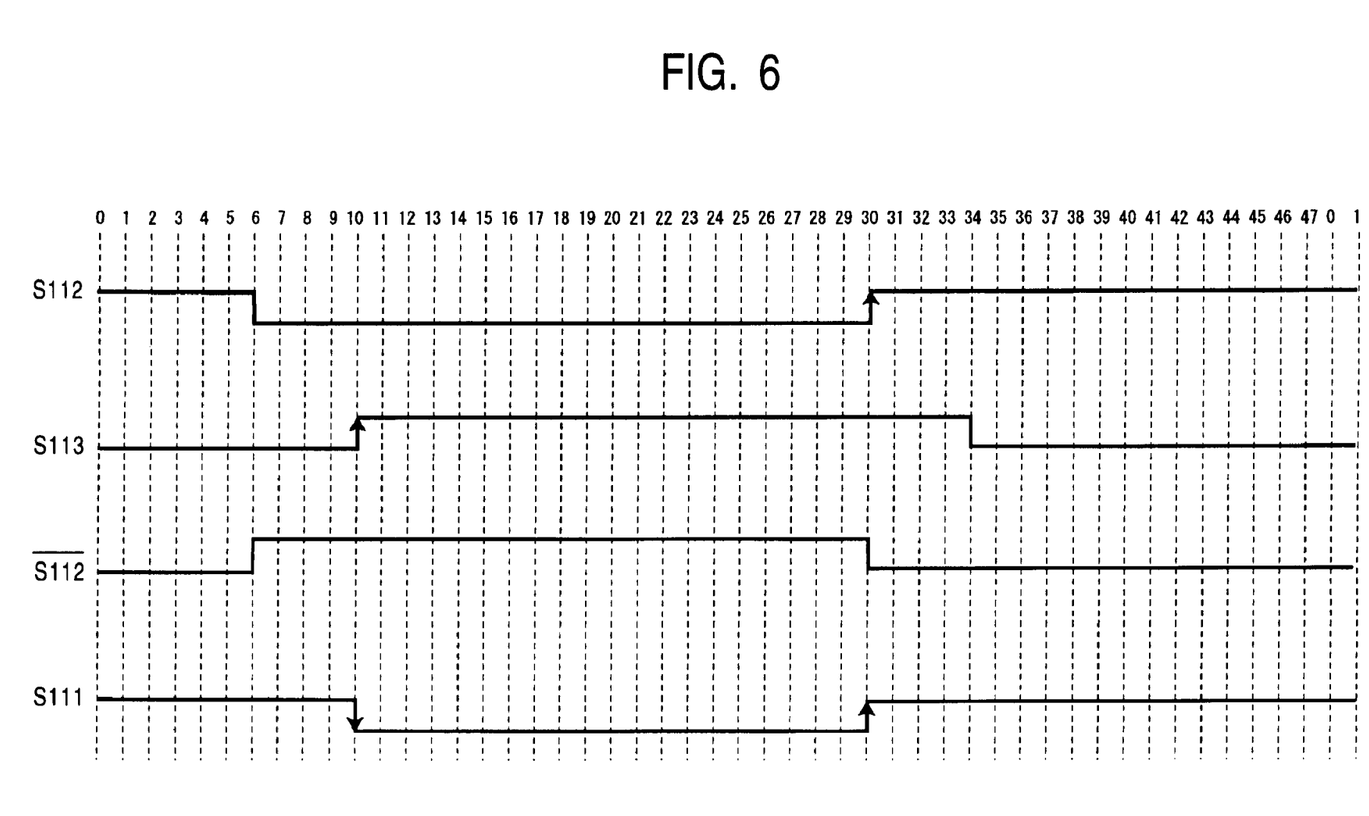
FIG. 6 is a timing chart of an output signal obtained using the first arithmetic circuit.

As described above, in both cases where the rise time is delayed with respect to the fall time by less than half the period (case (3)' described above) and where the rise time is advanced with respect to the fall time by more than half the period (case (7)' described above), "00" is output as the arithmetic circuit selection signal S117. This is because, in these cases, arithmetic processing performed on the first delay signal S112 and the second delay signal S113 by a first arithmetic circuit 9, which will be explained below, enables generation of the output signal S111 that changes at times designated by the rising edge designation signal S114 and the falling edge designation signal S115 (See FIG. 6).

Figure 7:
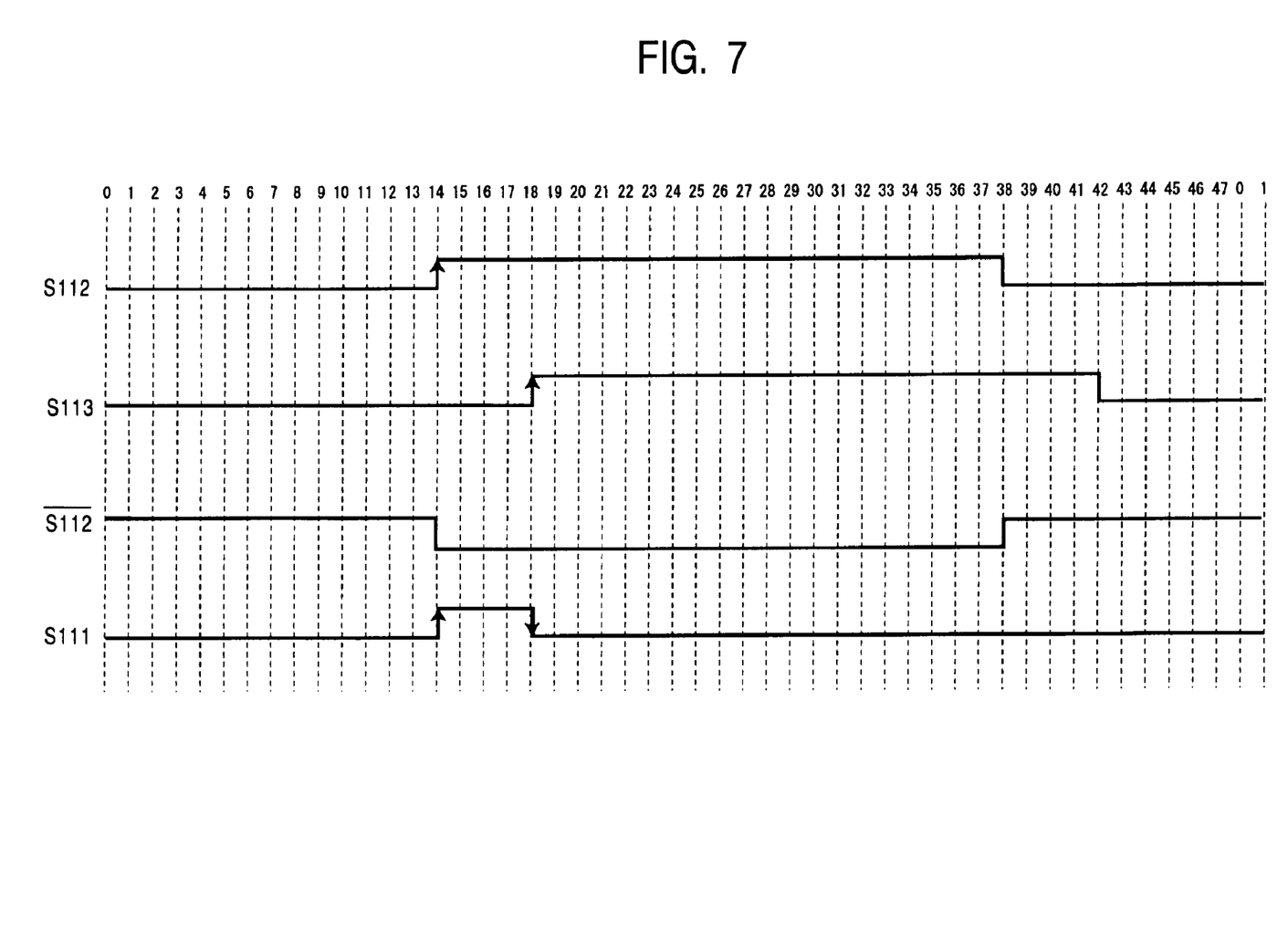
FIG. 7 is a timing chart of an output signal obtained using the second arithmetic circuit.

Also, in both cases where the rise time is delayed with respect to the fall time by more than half the period (case (1)' described above) and where the rise time is advanced with respect to the fall time by less than half the period (case (5)' described above), "01" is output as the arithmetic circuit selection signal S117. This is because, in these cases, arithmetic processing performed on the first delay signal S112 and the second delay signal S113 by a second arithmetic circuit 10, which will be described below, enables generation of the output signal S111 that changes at times designated by the rising edge designation signal S114 and the falling edge designation signal S115 (see FIG. 7).

Also, in both cases where the rise time is delayed with respect to the fall time by half the period (case (2)' described above) and where the rise time is advanced with respect to the fall time by half the period (case (6)' described above), "10" is output as the arithmetic circuit selection signal S117. This is because, in these cases, arithmetic processing performed by a third arithmetic circuit 11, which will be explained below, enables the first delay signal S112 to be output as the output signal S111 that changes at times designated by the rising edge designation signal S114 and the falling edge designation signal S115.

Also, in a case where the rise time is in phase with the fall time (case (4)' described above), "11" is output as the arithmetic circuit selection signal S117. This is because, in this case, since a time designated by the rising edge designation signal S114 is equal to a time designated by the falling edge designation signal S115 and such a signal cannot be generated, arithmetic processing performed by a fourth arithmetic circuit 12, which will be explained below, enables a ground (GND) level signal to be output as the output signal S111.

Referring back to FIG. 1, the generating circuit 5 includes the four arithmetic circuits 9 to 12, namely, the first arithmetic circuit 9 having a NAND gate, the second arithmetic circuit 10 having a NOR gate, the third arithmetic circuit 11 allowing only the first delay signal S112 to pass through as the output signal S111, and the fourth arithmetic circuit 12 for outputting a GND level signal as the output signal S111 for any first delay signal S112 and second delay signal S113.

Figure 4:
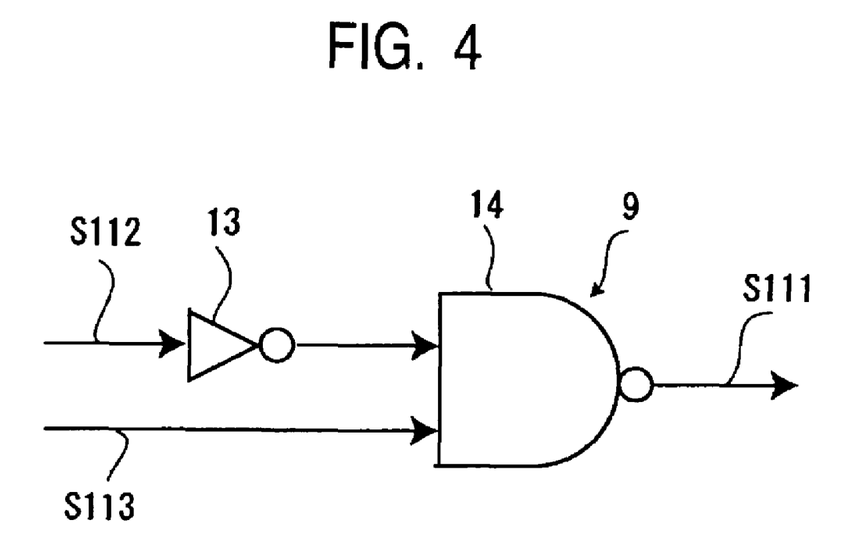
FIG. 4 is a circuit diagram of a first arithmetic circuit.

As shown in FIG. 4, in the first arithmetic circuit 9, an inversion signal obtained by inverting the first delay signal S112 by a NOT gate 13 and the second delay signal S113 are input to a NAND gate 14, and the NAND gate 14 outputs the output signal S111.

Figure 5:
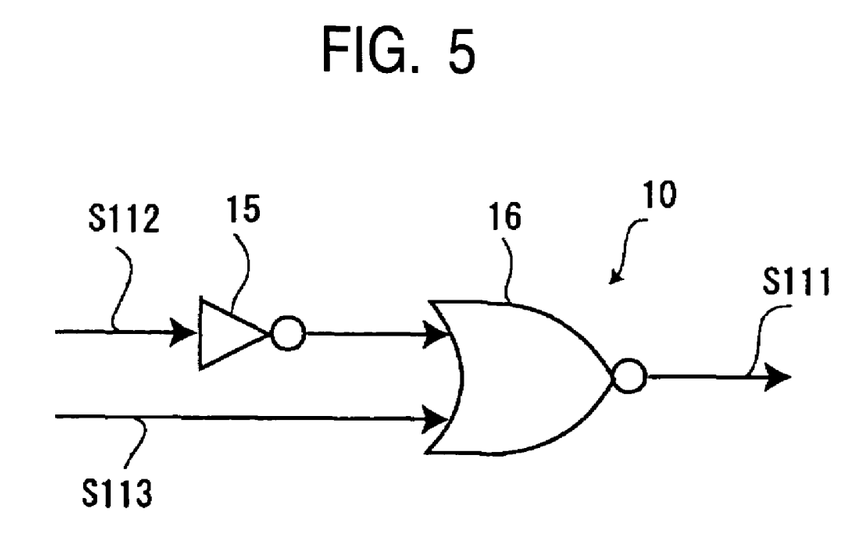
FIG. 5 is a circuit diagram of a second arithmetic circuit.

Also, as shown in FIG. 5, in the second arithmetic circuit 10, an inversion signal obtained by inverting the first delay signal S112 by a NOT gate 15 and the second delay signal S113 are input to a NOR gate 16, and the NOR gate 16 outputs the output signal S111.

In accordance with the arithmetic circuit selection signal S117, an arithmetic circuit suitable for generating the output signal S111 is selected from among the four arithmetic circuits 9 to 12.

In other words, in a case where the arithmetic circuit selection signal S117 is "00", the first arithmetic circuit 9 is selected. The first delay signal S112 and the second delay signal S113 are input to the first arithmetic circuit 9, and the first arithmetic circuit 9 performs the arithmetic processing described above on the first delay signal S112 and the second delay signal S113 so that the output signal S111 that rises at the same time as the rising edge of the first delay signal S112 and that falls at the same time as the rising edge of the second delay signal S113 is obtained (see FIG. 6).

Also, in a case where the arithmetic circuit selection signal S117 is "01", the second arithmetic circuit 10 is selected. The first delay signal S112 and the second delay signal S113 are input to the second arithmetic circuit 10, and the second arithmetic circuit 10 performs the arithmetic processing described above on the first delay signal S112 and the second delay signal S113 so that the output signal S111 that rises at the same time as the rising edge of the first delay signal S112 and that falls at the same time as the rising edge of the second delay signal S113 is obtained (see FIG. 7).

Also, in a case where the arithmetic circuit selection signal S117 is "10", the third arithmetic circuit 11 is selected, and the first delay signal S112 is output as the output signal S111. In this case, since the first delay signal S112 rises and falls at times designated by the rising edge designation signal S114 and the falling edge designation signal S115, the first delay signal S112 is output as the output signal S111.

Also, in a case where the arithmetic circuit selection signal S117 is "11", the fourth arithmetic circuit 12 is selected, and a GND level signal is output as the output signal S111. In this case, since a time designated by the rising edge designation signal S114 is equal to a time designated by the falling edge designation signal S115 and such a signal cannot be generated, a GND level signal is output as the output signal S111.

A case where an output signal S111 that rises at the same time as the rising edge of the delay signal S15 and that falls at the same time as the rising edge of the delay signal S19 is generated will be described as a specific example.

In order to generate such an output signal S111, "001111" (that is, "15" in decimal notation) as the rising edge designation signal S114 and "010011" (that is, "19" in decimal notation) as the falling edge designation signal S115 are input to the signal generating circuit A.

Then, the rising edge designation signal S114 and the falling edge designation signal S115 are input to the selecting circuit 3 and the phase relationship detecting circuit 4.

The selecting circuit 3 selects the first delay signal S15 on the basis of "001111" (that is, "15" in decimal notation) as the rising edge designation signal S114, and outputs the first delay signal S15 to the generating circuit 5. Also, the selecting circuit 3 selects the second delay signal S19 on the basis of "010011" (that is, "19" in decimal notation) as the falling edge designation signal S115, and outputs the second delay signal S19 to the generating circuit 5.

In the phase relationship detecting circuit 4, the rising edge designation signal S114 and the falling edge designation signal S115 are input to the most significant bit adder 6. "0" is added to the most significant bit of each of the rising edge designation signal S114 and the falling edge designation signal S115. The rising edge designation signal S114, "001111", is converted into a 7-bit rising edge designation signal S114', "0001111", and the falling edge designation signal S115, "010011", is converted into a 7-bit falling edge designation signal S115', "0010011". The rising edge designation signal S114' and the falling edge designation signal S115' are output to the complement subtracter 7.

The complement subtracter 7 first calculates two's complement "1110001" for the rising edge designation signal S114' "0001111". The falling edge designation signal S115' is added to the two's complement "1110001" of the rising edge designation signal S114' to detect the phase difference between the rise time designated by the rising edge designation signal S114 and the fall time designated by the falling edge designation signal S115. Then, the phase difference detection signal S116 "0000100" is output to the decoder 8.

In accordance with the relationship, "0000000" (that is, "0" in decimal notation)<the phase difference detection signal S116 "0000100" (that is, "4" in decimal notation) <"0011000" (that is, "24" in decimal notation), in other words, the fact that the rise time is advanced with respect to the fall time by less than half the period, the decoder 8 outputs the arithmetic circuit selection signal S117 "01" to the generating circuit 5.

The generating circuit 5 selects the second arithmetic circuit 10 on the basis of the arithmetic circuit selection signal S117 "01". The first delay signal S112 and the second delay signal S113 are input to the second arithmetic circuit 10. Arithmetic processing is performed on the first delay signal S112 and the second delay signal S113 to output the output signal S111.

Accordingly, the signal generating circuit A generates the output signal S111 that changes at the times designated by the rising edge designation signal S114 and the falling edge designation signal S115.

What is claimed is:

1. A signal generating circuit for generating an output signal, comprising:
   a delay-locked loop for generating a plurality of delay signals obtained by delaying a reference signal by predetermined time intervals;
   a selecting circuit for selecting, in accordance with a rising edge designation signal for designating a rise time and a falling edge designation signal for designating a fall time, a first delay signal rising at the rise time designated by the rising edge designation signal and a second delay signal rising at the fall time designated by the falling edge designation signal, from among the plurality of delay signals;
   a phase relationship detecting circuit for detecting the phase relationship between the first delay signal and the second delay signal, and generating a selection signal based on the detected phase relationship; and
   a generating circuit including two or more arithmetic circuits, for selecting one of the two or more arithmetic circuits based on the selection signal, and for outputting the output signal rising at the designated rise time and falling at the designated fall time by performing arithmetic processing using the selected one of the arithmetic circuits.

2. The signal generating circuit according to claim 1, wherein the phase relationship detecting circuit includes a most significant bit adder, a complement subtracter, and a decoder.

3. A driving device for generating an output signal for controlling the driving of a solid-state imaging device, the driving device comprising a signal generating circuit for generating the output signal, wherein
   the signal generating circuit includes:
   a delay-locked loop for generating a plurality of delay signals obtained by delaying a reference signal by predetermined time intervals;
   a selecting circuit for selecting, in accordance with a rising edge designation signal for designating a rise time and a falling edge designation signal for designating a fall time, a first delay signal rising at the rise time designated by the rising edge designation signal and a second delay signal rising at the fall time designated by the falling edge designation signal, from among the plurality of delay signals;
   a phase relationship detecting circuit for detecting the phase relationship between the first delay signal and the second delay signal, and generating a selection signal based on the detected phase relationship; and
   a generating circuit including two or more arithmetic circuits, for selecting one of the two or more arithmetic circuits based on the selection signal, and for outputting the output signal rising at the designated rise time and falling at the designated fall time by performing arithmetic processing using the selected one of the arithmetic circuits.

4. The driving device according to claim 3, wherein the phase relationship detecting circuit includes a most significant bit adder, a complement subtracter, and a decoder.

5. An image capturing apparatus including a driving device for generating an output signal for controlling driving of a solid-state imaging device, the image capturing apparatus comprising a signal generating circuit for generating the output signal, wherein
   the signal generating circuit includes:
   a delay-locked loop for generating a plurality of delay signals obtained by delaying a reference signal by predetermined time intervals;
   a selecting circuit for selecting, in accordance with a rising edge designation signal for designating a rise time and a falling edge designation signal for designating a fall time, a first delay signal rising at the rise time designated by the rising edge designation signal and a second delay signal rising at the fall time designated by the falling edge designation signal, from among the plurality of delay signals;
   a phase relationship detecting circuit for detecting the phase relationship between the first delay signal and the second delay signal, and generating a selection signal based on the detected phase relationship; and
   a generating circuit including two or more arithmetic circuits, for selecting one of the two or more arithmetic circuits based on the selection signal, and for outputting the output signal rising at the designated rise time and falling at the designated fall time by performing arithmetic processing using the selected one of the arithmetic circuits.

6. The image capturing apparatus according to claim 5, wherein the phase relationship detecting circuit includes a most significant bit adder, a complement subtracter, and a decoder.

7. A signal generating circuit for generating an output signal, comprising:
   a delay-locked loop for generating a plurality of delay signals obtained by delaying a reference signal by predetermined time intervals;
   a selecting circuit for selecting, in accordance with a rising edge designation signal for designating a predetermined rise time and a falling edge designation signal for designating a predetermined fall time, a first delay signal rising at the time designated by the rising edge designation signal and a second delay signal rising at the time designated by the falling edge designation signal from among the plurality of delay signals;

a phase relationship detecting circuit for detecting the phase relationship between the first delay signal and the second delay signal; and a generating circuit including an arithmetic circuit, the generating circuit outputting the output signal rising at the predetermined rise time and falling at the predetermined fall time by performing arithmetic processing on the first delay signal and the second delay signal using the arithmetic circuit corresponding to the result of the detection, wherein the phase relationship detecting circuit includes a most significant bit adder, a complement subtracter, and a decode.

8. A driving device for generating a predetermined output signal for controlling the driving of a solid-state imaging device, the driving device comprising a signal generating circuit for generating the output signal, wherein the signal generating circuit includes:

a delay-locked loop for generating a plurality of delay signals obtained by delaying a reference signal by predetermined time intervals;

a selecting circuit for selecting, in accordance with a rising edge designation signal for designating a predetermined rise time and a falling edge designation signal for designating a predetermined fall time, a first delay signal rising at the time designated by the rising edge designation signal and a second delay signal rising at the time designated by the falling edge designation signal from among the plurality of delay signals;

a phase relationship detecting circuit for detecting the phase relationship between the first delay signal and the second delay signal; and a generating circuit including an arithmetic circuit, the generating circuit outputting the output signal rising at the predetermined rise time and falling at the predetermined fall time by performing arithmetic processing on the first delay signal and the second delay signal using the arithmetic circuit corresponding to the result of the detection, wherein the phase relationship detecting circuit includes a most significant bit adder, a complement subtracter, and a decoder.

9. An image capturing apparatus including a driving device for generating a predetermined output signal for controlling driving of a solid-state imaging device, the image capturing apparatus comprising a signal generating circuit for generating the output signal, wherein the signal generating circuit includes:

a delay-locked loop for generating a plurality of delay signals obtained by delaying a reference signal by predetermined time intervals;

a selecting circuit for selecting, in accordance with a rising edge designation signal for designating a predetermined rise time and a falling edge designation signal for designating a predetermined fall time, a first delay signal rising at the time designated by the rising edge designation signal and a second delay signal rising at the time designated by the falling edge designation signal from among the plurality of delay signals;

a phase relationship detecting circuit for detecting the phase relationship between the first delay signal and the second delay signal; and a generating circuit including an arithmetic circuit, the generating circuit outputting the output signal rising at the predetermined rise time and falling at the predetermined fall time by performing arithmetic processing on the first delay signal and the second delay signal using the arithmetic circuit corresponding to the result of the detection, wherein the phase relationship detecting circuit includes a most significant bit adder, a complement subtracter, and a decoder.

* * * * *